United States Patent
Hsu et al.

(10) Patent No.: US 7,524,429 B2
(45) Date of Patent: Apr. 28, 2009

(54) METHOD OF MANUFACTURING DOUBLE-SIDED PRINTED CIRCUIT BOARD

(75) Inventors: Hung-En Hsu, Taipei (TW); Binwei Wang, Taipei (TW); Shing-Fun Ho, Taipei (TW)

(73) Assignee: Nan Ya Printed Circuit Board Corporation, Taoyuan (TW)

( * ) Notice: Subject to any disclaimer, the term of this patent is extended or adjusted under 35 U.S.C. 154(b) by 126 days.

(21) Appl. No.: 11/610,512

(22) Filed: Dec. 14, 2006

(65) Prior Publication Data

US 2007/0084823 A1    Apr. 19, 2007

Related U.S. Application Data

(63) Continuation-in-part of application No. 11/160,067, filed on Jun. 7, 2005, now abandoned.

(30) Foreign Application Priority Data

Sep. 10, 2004   (TW) ............................... 93127598 A (51) Int. Cl.
*H01B 13/00*   (2006.01)
(52) U.S. Cl. .............................. 216/18; 216/13; 216/17; 205/125

(58) Field of Classification Search .................... 216/13, 216/18, 37, 43, 17; 205/125, 159
See application file for complete search history.

(56) References Cited

U.S. PATENT DOCUMENTS

| 6,775,907 | B1 | 8/2004 | Boyko | |
|---|---|---|---|---|
| 7,256,495 | B2 * | 8/2007 | Lee et al. | 257/737 |
| 2001/0002294 | A1 * | 5/2001 | Hatakeyama et al. | 428/209 |
| 2003/0188886 | A1 * | 10/2003 | Fey et al. | 174/256 |
| 2005/0121229 | A1 * | 6/2005 | Takai et al. | 174/261 |

FOREIGN PATENT DOCUMENTS

CN   1003974   4/1989

* cited by examiner

*Primary Examiner*—Lan Vinh
(74) *Attorney, Agent, or Firm*—Winston Hsu (57) ABSTRACT

The present invention provides a method of manufacturing a double-sided printed circuit board. An insulation substrate is first formed by creating a plurality of through holes on a Copper Clad Laminate (CCL) whose copper foil surface has been removed. Next, an electro-less copper layer is plated on the substrate for forming a plurality of plated through holes. After a wire pattern is formed on the substrate, a solder preventive layer is formed on top of the wire pattern. Next, a plurality of openings is created in between the solder preventive layer for exposing the contact pads. Finally, a protective layer is plated on top of the contact pads.

6 Claims, 8 Drawing Sheets

METHOD OF MANUFACTURING DOUBLE-SIDED PRINTED CIRCUIT BOARD

CROSS REFERENCE TO RELATED APPLICATIONS

This is a continuation-in-part of U.S. application Ser. No. 11/160,067 filed Jun. 7, 2005.

BACKGROUND OF THE INVENTION

1. Field of the Invention

The present invention relates to a method of fabricating a double-sided printed circuit board, and more particularly, to a method of fabricating a double-sided circuit board with superfine circuits and high density circuits.

2. Description of the Prior Art

In recent history, printed circuit boards (PCBs) have been widely used for carrying various electronic components and devices. As there is demand for electronic products to be lighter, smaller, and portable, research and development of printed circuit boards is unavoidably moving toward a direction of miniaturization, higher integration, lower thickness, and the use of multiple layers.

In general, printed circuit boards having circuit layouts on both sides of the circuit boards have been widely used in numerous electrical apparatuses such as air-conditioners, telephones, and fax machines. Nevertheless, it is essential to have a "bridge", or otherwise referred to as through holes, for communicating between the circuits and electrical wires on both sides of the board. The useable area of a typical double-sided printed circuit board is often twice that of a typical single-sided printed circuit board, and in contrast to a single-sided printed circuit board, the double-sided printed circuit board is more suitable to be used for products with complex circuits.

Figure 1:
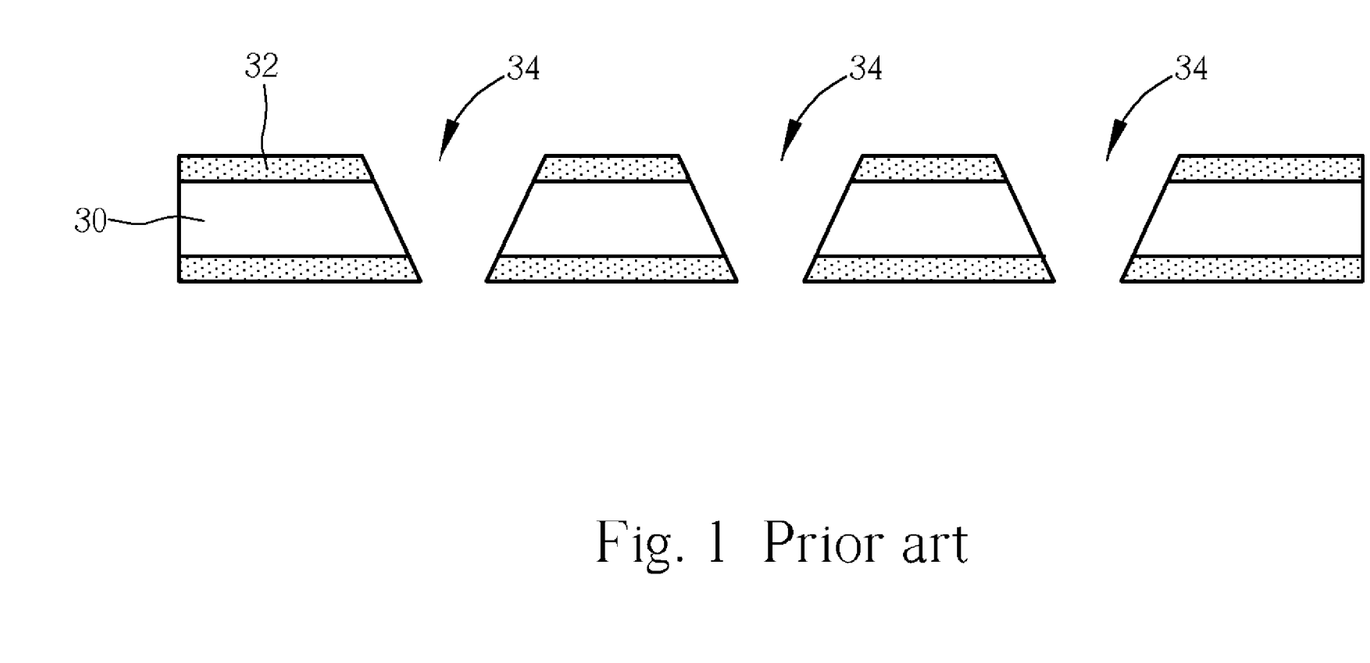
FIG. 1 is a perspective diagram showing a double-sided printed circuit board after a laser drilling process is performed according to the prior art.

Please refer to FIG. 1. FIG. 1 is a perspective diagram showing a double-sided printed circuit board after a mechanical drilling process is performed according to the prior art. In the past, the mechanical drilling processes have always been performed on a substrate 30 covered with a copper clad 32 (together referred to as a copper clad laminate, CCL). The limit of the conventional mechanical drilling technique is about 75 micrometers (diameter of the drilled hole on CCL). It is very difficult to form a drilled hole with diameter smaller than 75 micrometers by conventional mechanical drilling technique. In order to drill through the copper clad 32 and the substrate 30, enormous time and effort have to be spent. Consequently, the mechanical drilling will increase the diameters of the through holes 34, thereby reducing the amount of useful space. Moreover, the thickness of the substrate 30 will also increase significantly if additional patterns need to be added. Hence it becomes a major disadvantage for the traditional method to fabricate printed circuit boards with superfine wires and circuits with higher integration. There is a need in this industry to provide a method of forming a through hole with smaller dimensions on the PCB substrate.

SUMMARY OF THE INVENTION

It is therefore an objective of the present invention to provide a method of fabricating a double-sided printed circuit board for obtaining a printed circuit board with superfine circuits and increased circuit density.

According to the preferred embodiment of the present invention, a method of fabricating a double-sided printed circuit board comprises: providing a copper clad laminate (CCL) with copper clad removed or an insulating substrate; performing a drilling process for forming a plurality of through holes in the insulating substrate; disposing a copper layer on the insulating substrate and the sidewall of the through holes for forming a plurality of plated through holes; forming a wire pattern on the surface of the insulating substrate, wherein the wire pattern includes at least one contact pad; forming a solder resistant layer on the surface of the insulating substrate and forming at least one opening in the solder resistant layer for exposing the contact pad; and coating a protective layer on the surface of the contact pad.

By performing a drilling process on a CCL with the removed copper clad, the present invention is able to reduce the amount of time and effort required for a typical drilling and etching process, and decrease the diameter of the through holes, thereby producing printed circuit board with superfine wires and increasing the overall wire integration.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
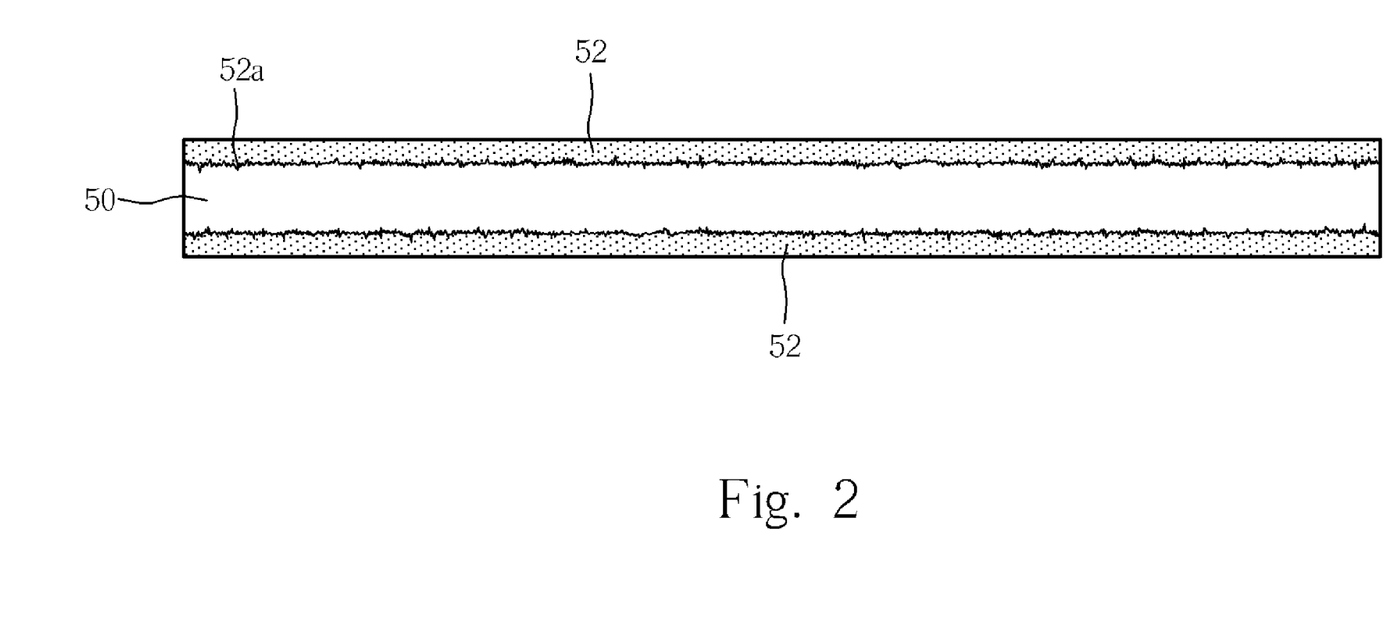
FIG. 2 to FIG. 8 are perspective diagrams showing the method of fabricating a double-sided printed circuit board according to the present invention.

Please refer to FIG. 2 to FIG. 8. FIG. 2 to FIG. 8 are perspective diagrams showing the method of fabricating a double-sided printed circuit board according to the present invention. First, a copper clad laminate (CCL) is provided, in which the CCL comprises an insulating substrate and at least one copper clad disposed on the surface of the insulating substrate. As shown in FIG. 2, a copper clad 52 is formed on both top and bottom surface of the insulating substrate 50. The copper clad 52 is laminated on the insulating substrate 50 by pressing processes. The surface of the copper clad 52 is not completely plane, instead, it is an irregular plane having thereon a plurality of protruding copper teeth 52a which are recessed into the surface of the insulating substrate 50 after pressing.

Figure 3:
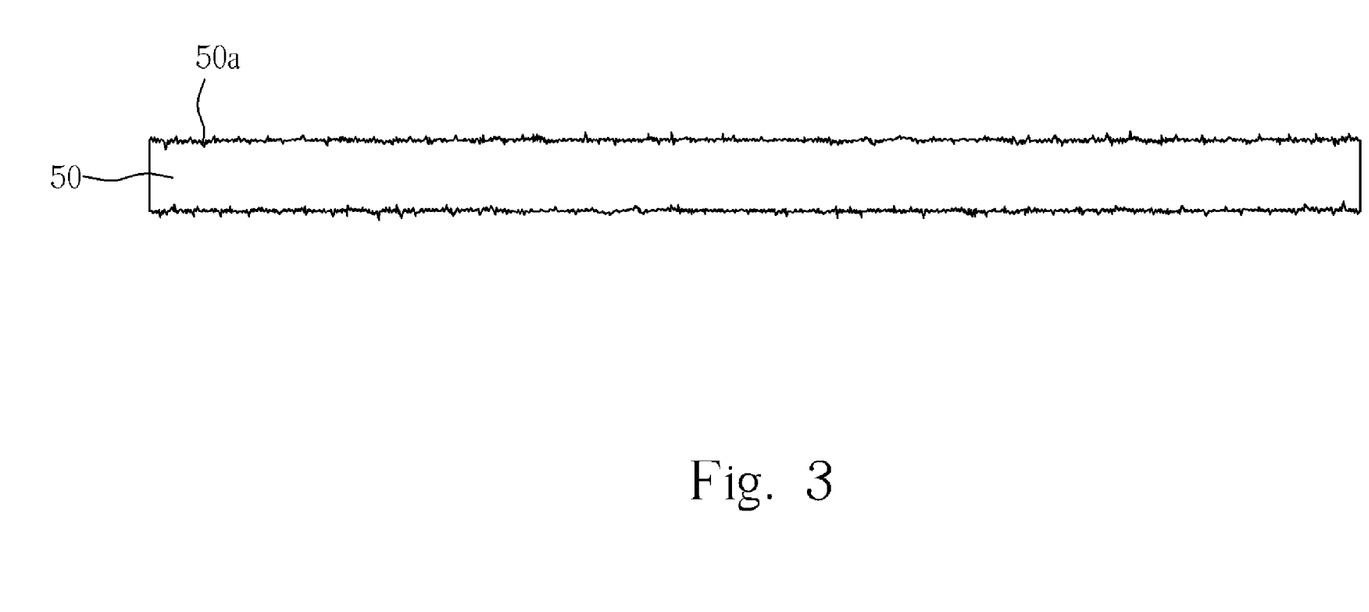

Next, as shown in FIG. 3, an etching process is performed for removing the copper clad 52 including the copper teeth 52a from the surface of the insulating substrate 50, leaving a plurality of recesses 50a on the surface of the insulating substrate 50. It is advantageous to use this invention method because by removing the copper clad 52 and copper teeth 52a the surface roughness is increased and the thickness of the PCB is reduced. Alternatively, in accordance with another embodiment of this invention, the CCL can be substituted with an insulating substrate without the additional copper clad layer for saving an extra step of removing the copper clad.

Figure 4:
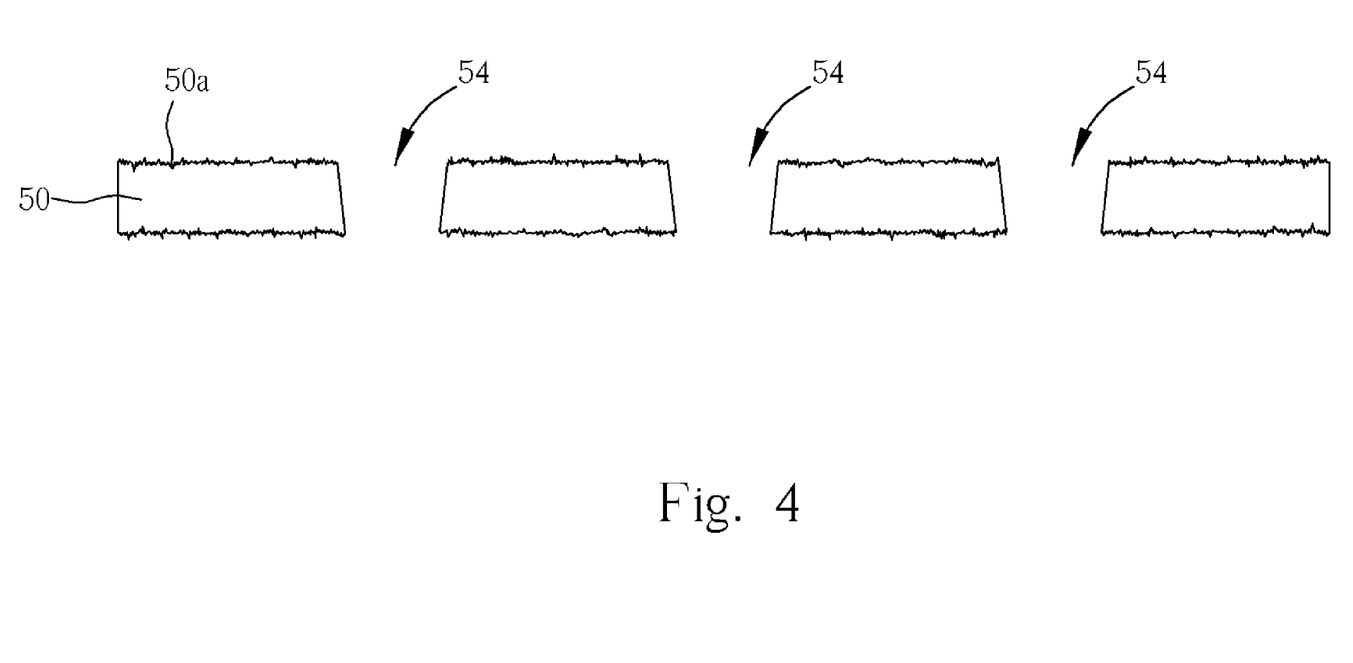

As shown in FIG. 4, since the copper clad 52 is removed, a laser drilling process can be performed to form a plurality of through holes 54 in the insulating substrate 50. The laser drilling technique can produce much smaller through hole (<50 micrometers) than the prior art mechanical drilling. Alternatively, vias can be formed instead for connecting different layers of the printed circuit board. Currently, the minimum through hole formed by the laser drilling technique is about 30 micrometers. In the future, as the advance of the laser drilling tools, the through hole can be even smaller, thereby increasing the hole density and this meets the trends of lighter, thinner, shorter and smaller PCB board.

Figure 5:
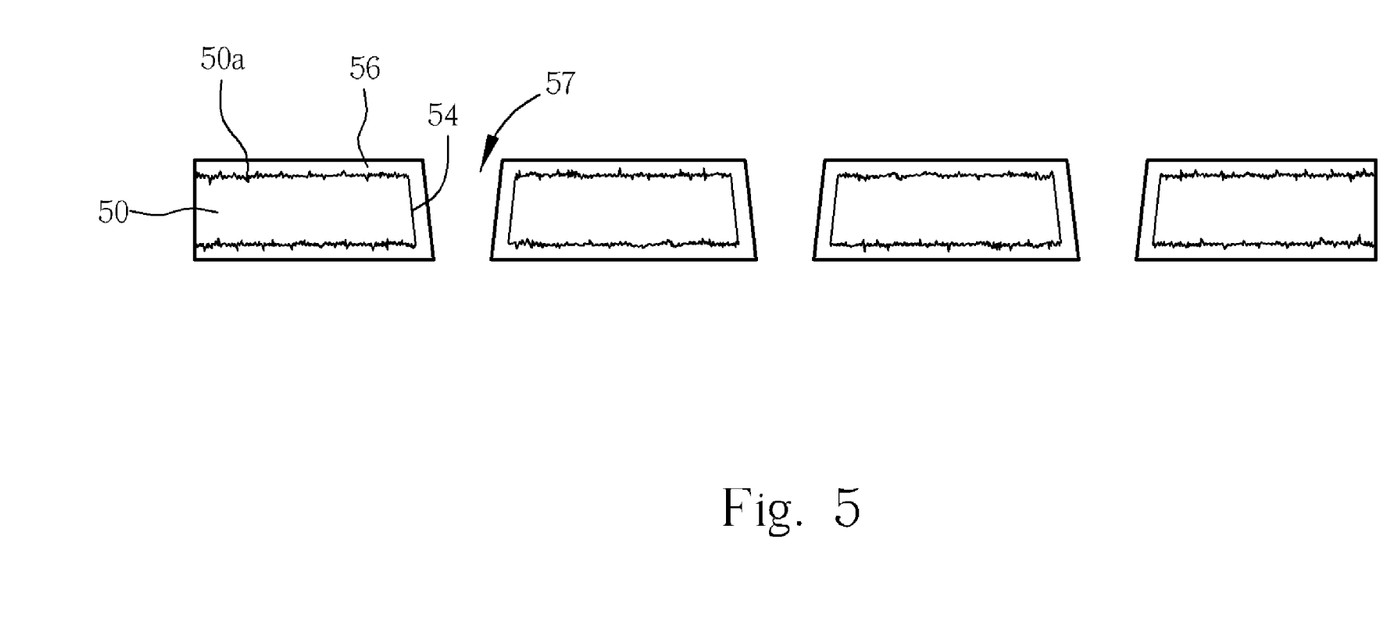

As shown in FIG. 5, a coarsening process is performed on the surface of the insulating substrate 50 and the through holes 54 for increasing the surface roughness of the insulating substrate 50 and through hole 54, thereby increasing the adhesion ability of chemical copper to each surface. Next, a chemical copper layer 56 is disposed on the insulating substrate 50 and the sidewall of each through hole 54 for forming a plurality of plated through holes 57. The chemical copper layer 56 also fills the recesses 50a.

Figure 6:
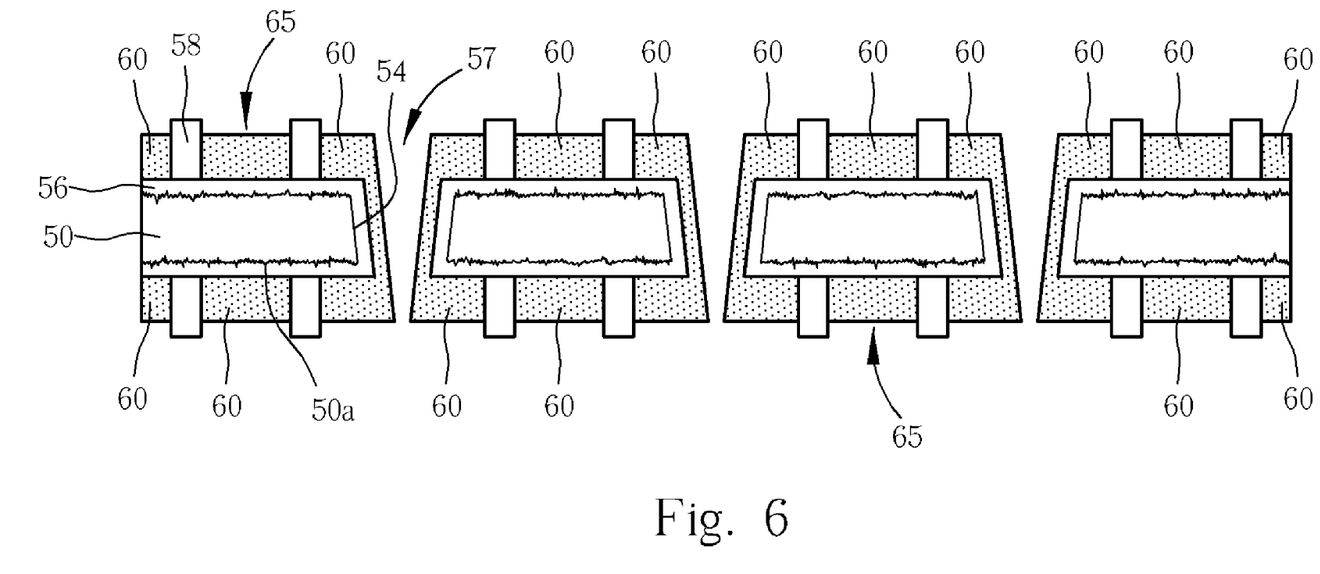

As shown in FIG. 6, a photoresist pattern 58, serving as photo mask, is then transferred to both sides of the insulating substrate 50. Next, an electroplating process is performed for forming an electroplating copper layer 60 on the surface of the insulating layer 50 not covered by the photoresist pattern 58 and the sidewall of each through hole 54. The copper layer 60, also serving as the electrical circuit, comprises at least one contact pad 65.

Figure 7:
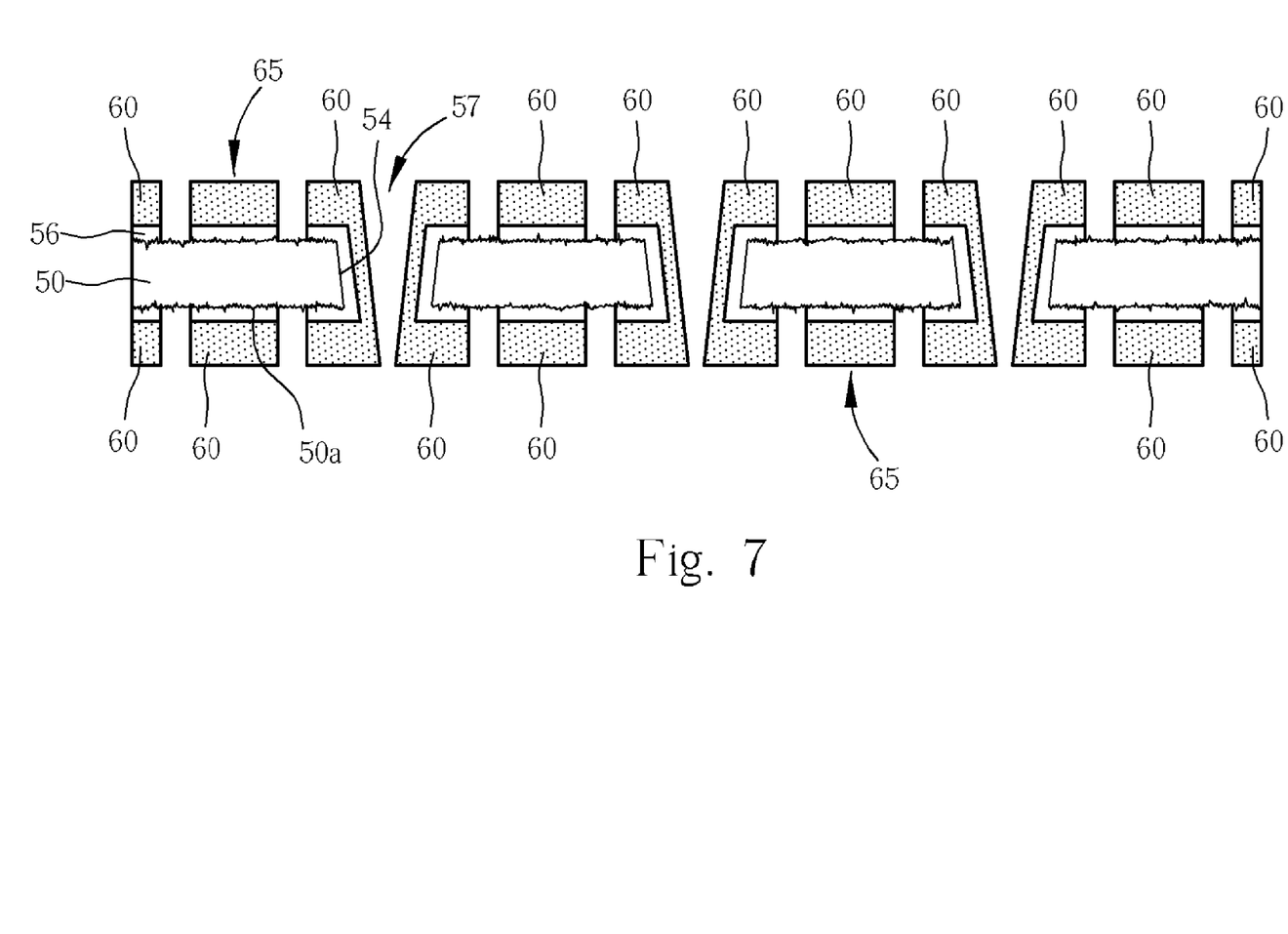

As shown in FIG. 7, a photo stripping process is performed for removing the photoresist pattern 58. Next, an etching process is performed on the insulating substrate 50 for removing the exposed chemical copper layer 56. In general, the thickness of the copper clad 52 is approximately 10-12 μm whereas the thickness of the chemical copper layer 56 is only 0.1-1 μm. According to the present invention, the copper clad 52 is first removed. Since the copper thickness on the surface of the insulating substrate 50 is much reduced, only the chemical copper layer 56, which is much smaller in thickness compared to the removed copper clad 52, is etched by the etching process. The surface and sidewall of the electroplating copper layer 60 are etched at the same time when etching the exposed chemical copper layer 56. The etched thickness of the surface and sidewall of the electroplating copper layer 60 is substantially the same as the thickness of the chemical copper layer 56, which is much reduced compared to the prior art. By decreasing the etched thickness of the electroplating copper layer 60, the process is able to fabricate printed circuit boards that are not only smaller in size, but also with much finer wire layout and higher circuit integration.

Figure 8:
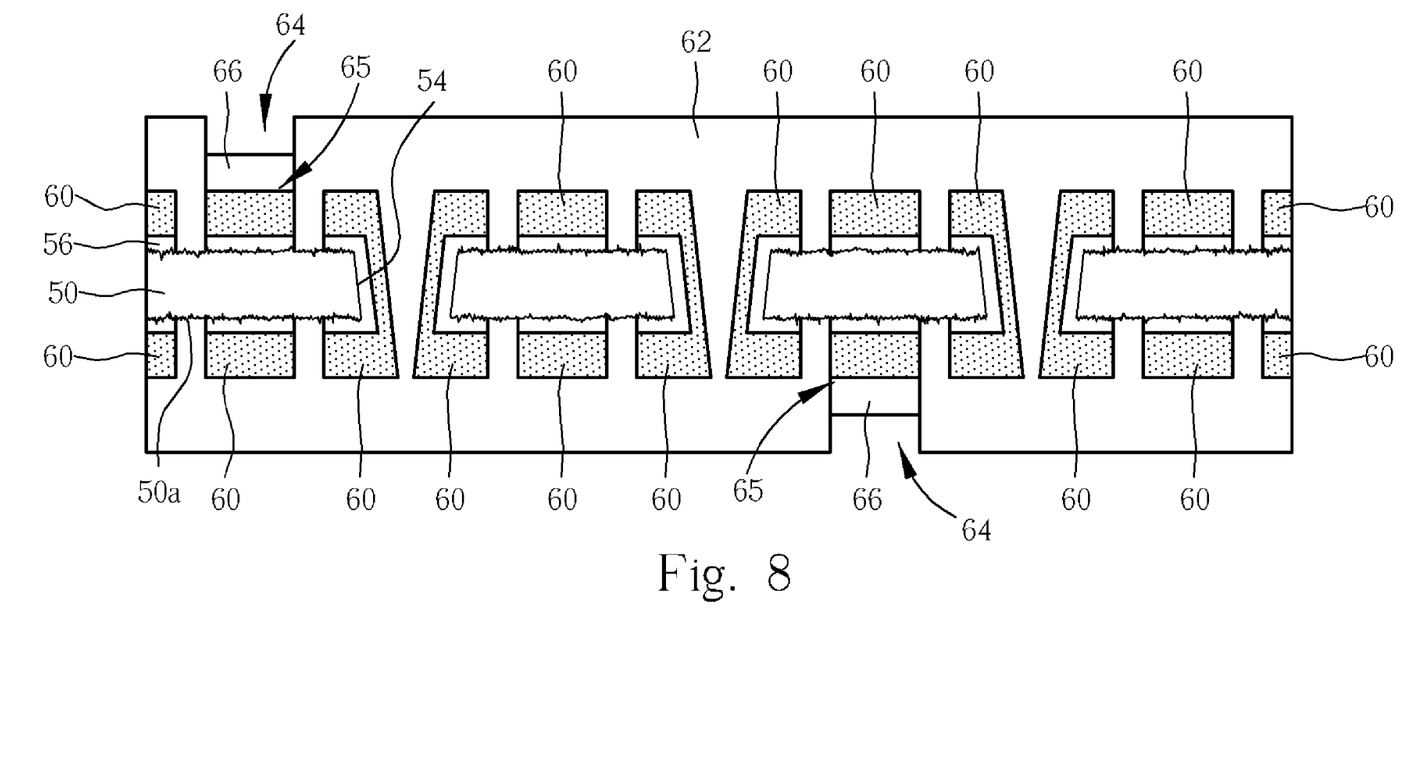

As shown in FIG. 8, a solder resistant layer 62 is then formed on the insulating substrate. Next, an opening 64 is formed in the solder resistant layer 62 directly above the contact pad 65 for exposing the contact pad 65. Eventually, a protective layer 66 is formed on the surface of the contact pad 65, in which the protective layer 66 is comprised of materials including nickel, gold, or organic solder preservative (OSP).

In addition to the fabrication stated above, the present invention can also be utilized in multilayer printed circuit board fabrication by removing the copper clad from the upper-most layer and the lower-most layer, and stacking the boards on top of one another.

In contrast to the prior art, the present invention provides a method of fabricating a double-sided printed circuit board by performing a laser drilling process on an insulating substrate of a CCL wherein the copper clad is first removed. By using the starting insulating substrate that is much thinner than the traditional CCL, the present invention is able to reduce the amount of time and effort required for a typical drilling and etching process, decrease the diameter of the through holes, and eventually produce printed circuit boards with superfine wires and increase the overall wire integration.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a printed circuit board, comprising:
   providing a copper clad laminate (CCL) comprising an insulating substrate sandwiched by copper clads, the copper clads having thereon a plurality of copper teeth inlaid into respective surfaces of the insulating substrate;
   completely removing the copper clads and the copper teeth thereof from the surfaces of the insulating substrate, leaving recesses on the surfaces of the insulating substrate, which increases surface roughness of the insulating substrate;
   after completely removing the copper clads, laser drilling the insulating substrate to form at least one through hole;
   plating a chemical copper layer on the insulating substrate and sidewall of the through hole;
   forming a wire pattern on the surfaces of the insulating substrate, wherein the wire pattern includes at least one contact pad;
   forming a solder resistant layer on the surface of the insulating substrate, wherein the solder resistant layer has at least one opening exposing the contact pad; and
   coating a protective layer on the contact pad.

2. The method of claim 1, wherein before plating the chemical copper layer, a surface treatment is performed to increase adhesiveness between the insulating substrate and the chemical copper layer.

3. The method of claim 1, wherein the formation of wire pattern further comprises:
   forming a photoresist pattern on the insulating substrate;
   forming an electroplating copper layer onto the insulating substrate not covered by the photoresist pattern and onto the sidewall of the through hole;
   removing the photoresist to expose a portion of the chemical copper layer; and
   etching away the exposed chemical copper layer.

4. The method of claim 1, wherein the protective layer comprises nickel.

5. The method of claim 1, wherein the protective layer comprises gold.

6. The method of claim 1, wherein the through hole has a diameter that is smaller or equal to 30 micrometers.

* * * * *